United States Patent [19]

Suzuki et al.

[11] Patent Number: 4,624,214
[45] Date of Patent: Nov. 25, 1986

[54] DRY-PROCESSING APPARATUS

[75] Inventors: Keizo Suzuki, Hachioji; Ken Ninomiya, Tokyo; Shigeru Nishimatsu, Kokubunji; Sadayuki Okudaira, Ome, all of Japan

[73] Assignee: Hitachi, Ltd., Tokyo, Japan

[21] Appl. No.: 742,389

[22] Filed: Jun. 10, 1985

Related U.S. Application Data

[63] Continuation of Ser. No. 539,387, Oct. 6, 1982, abandoned.

[30] Foreign Application Priority Data

Oct. 8, 1982 [JP] Japan ................ 57-176134

[51] Int. Cl.$^4$ ......................... H01L 21/306
[52] U.S. Cl. .................... 118/719; 118/723; 118/724; 118/50.1; 156/345; 156/643; 204/192.32
[58] Field of Search .............. 118/724, 723, 719, 50.1; 156/345, 643; 204/192 E

[56] References Cited

U.S. PATENT DOCUMENTS

| | | | |
|---|---|---|---|
| 3,213,825 | 10/1965 | Cooper et al. | 118/724 |
| 3,233,137 | 2/1966 | Anderson et al. | 204/192 E |
| 3,310,424 | 3/1967 | Wehner et al. | 118/724 X |
| 3,598,710 | 8/1971 | Davidse | 204/192 E |
| 4,192,706 | 3/1980 | Horiike | 204/164 X |
| 4,259,145 | 3/1981 | Harper et al. | 156/345 X |
| 4,265,730 | 5/1981 | Hirose et al. | 204/298 |
| 4,292,384 | 9/1981 | Straughan et al. | 156/643 X |
| 4,406,733 | 9/1983 | Tachi | 156/643 |

FOREIGN PATENT DOCUMENTS

| | | | |
|---|---|---|---|
| 108579 | 8/1979 | Japan | 204/192 E |
| 125976 | 9/1979 | Japan | 204/192 E |

OTHER PUBLICATIONS

Gloerser, "Masking for Ion Beam Etching", Solid State Technology, pp. 68-73, Apr. 1976.
Kaufman et al, "Technology and Applications of Broad-Beam Ion . . . ", J. Vac. Sci. Tech., vol. 21, No. 3, Sep./Oct. 1982, pp. 725-736.
"The Roles of Ions and Neutral Active Species in Microwave Plasma Etching", by Keizo Suzuki et al., J. Electrochem. Soc.: Solid-State Science and Technology, vol. 126, No. 6, pp. 1024-1028.

Primary Examiner—Richard Bueker
Attorney, Agent, or Firm—Antonelli, Terry & Wands

[57] ABSTRACT

In a dry-processing apparatus adapted for vapor phase deposition or vapor phase etching, the processing space in its processing chamber is covered with a cooled member provided for trapping reflecting active particles and preventing degassing, thereby permitting processing with gas of high purity substantially free from impurities. The active particles are incident upon a workpiece in a unidirectional flow. Means for uniformalyzing the direction of movement of active particles may be further provided. The apparatus is especially useful for vertical etching of a semiconductor substrate with neutral radicals.

9 Claims, 6 Drawing Figures

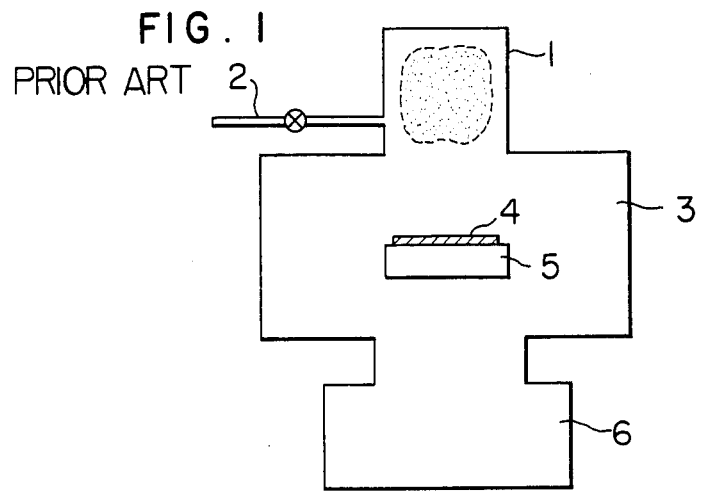
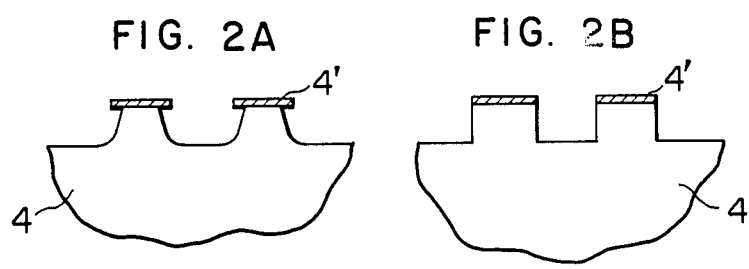
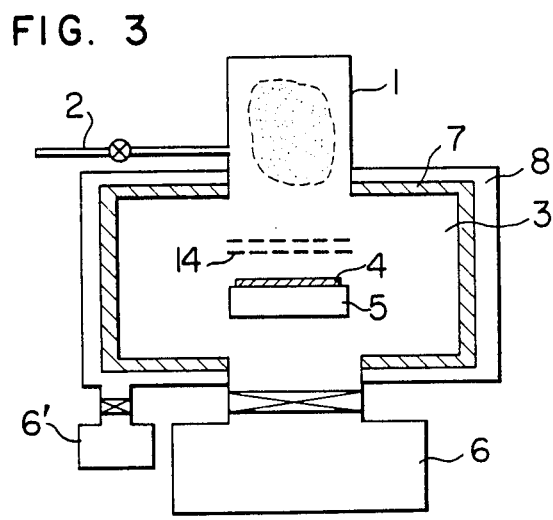

DRY-PROCESSING APPARATUS

This application is a continuation of application Ser. No. 539,387, filed Oct. 6, 1982, now abandoned.

BACKGROUND OF THE INVENTION

1. Field of the Invention

This invention relates to improvements in a dry-processing apparatus for processing the surface of a workpiece using a vapor phase, and more particularly to prevention of degassing from and reflection of active particles at the inner wall of the reaction chamber of an apparatus of the kind above-described.

2. Description of the Prior Art

FIG. 1 shows the fundamental structure of a prior art dry-processing apparatus. Referring to FIG. 1, the prior art dry-processing apparatus is composed of a gas decomposing chamber 1 provided with gas decomposing means such as an external coil and internal parallel planar electrodes, gas introducing means 2 such as an etching gas supply pipe provided with a leak valve, a reaction chamber 3, a workpiece support 5 disposed in the reaction chamber 3 for supporting a workpiece 4 thereon, and an evacuation system 6. The workpiece 4 is not necessarily placed in the reaction chamber 3 and may be placed in the gas decomposing means. The functions of the gas decomposing means include:

(1) to decompose molecules of the introduced gas;

(2) to excite molecules of the introduced gas or their decomposition products; and (3) to effect an ion and/or molecule reaction such as polymerization of molecules of the introduced gas or their decomposition products.

The gas decomposing means is classified into two types which are: (1) means for producing plasma in a portion of the reaction chamber 3 or in the gas decomposing chamber 1 connected to the reaction chamber 3; and (2) means for introducing light into a portion of the reaction chamber 3 or into the gas decomposing chamber 1 for decomposing the gas with the light. The former means, that is, the means for producing the plasma includes DC discharge (1), RF discharge (2), microwave discharge in the absence of a magnetic field (3), microwave discharge in the presence of a magnetic field (4), etc. And, the light introduced for gas decomposition includes infrared radiation ($CO_2$ laser having a wavelength of, for example, about 9 to 10 $\mu m$), visible radiation (Ar laser having a wavelength of, for example, about 0.5 $\mu m$), etc (5). From the aspect of principle, ultraviolet radiation having a wavelength not longer than 0.2 $\mu m$ is also usable.

(1) Yoshihiro Hamakawa: Solid-state Phisics (Kotai Butsuri, Japan) 14-10 (1979), pp. 43–53

(2) Tsutomu Tsukada et al.: Vacuum (Shinku, Japan) 23-9 (1980), pp. 1–10

(3) Takuo Sugano (Editor): "Application of Plasma Process to VLSI Technology" pp. 120–138, published by Sangyo Tosho Ltd.

(4) The same, pp. 138–153

(5) T. J. Chuang: IBM J. RES. DEVELOP. 26-2 (1982), pp. 145–150

In the dry-processing apparatus having such a construction, active particles (ions and neutral radicals) produced in the gas decomposing chamber 1 and arriving at the surface of the workpiece 4 make physical and chemical reactions with the workpiece surface 4 thereby effecting surface processing such as etching or deposition. In this case, it is needless to mention that the gas to be decomposed is introduced into the gas decomposing chamber 1 by the gas introducing means 2.

A problem encountered in the case of etching of the workpiece 4 by the use of such a dry-processing apparatus will be described with reference to FIGS. 2A and 2B.

In FIG. 2A, the workpiece 4, which is a semiconductor element, is subjected to isotropic etching through a mask 4' and has a sectional shape as shown after etching. On the other hand, in FIG. 2B, the workpiece 4 is subjected to directional (vertical) etching through the mask 4' and has a sectional shape as shown after etching. In order that the workpiece 4 can be most finely processed according to the pattern provided by the mask 4', the vertical etching meeting exactly the masking pattern 4' is fundamentally more preferable than the isotropic etching. (A technique which can freely control any desired intermediate state between the vertical etching and the isotropic etching will be more useful.)

As described already, ions and neutral radicals are present as active particles contributing to the process of vapor phase etching. Among these active particles, the ions can attain the vertical etching since the ions are vertically incident upon the surface of the workpiece 4 by being accelerated by the electric field. However, the neutral radicals provide the isotropic etching, since the neutral radicals are free from the influence of the electric field and are isotropically incident upon the surface of the workpiece 4 by being reflected by the inner wall of the reaction chamber 3. On the other hand, vapor phase etching with the accelerated ions tends to impart damage to the surface layer of the workpiece 4, but such damage to the surface layer of the workpiece 4 does not occur in the case of vapor phase etching with the neutral radicals.

Therefore, in a dry-etching apparatus, especially, that for processing a semiconductor element vertical etching with neutral radicals is especially desirable.

A problem as pointed out below is encountered when the dry-processing apparatus shown in FIG. 1 is used as a deposition apparatus (a film forming apparatus). The active particles produced in the gas decomposing chamber 1 impinge against the inner wall of the reaction chamber 3 to release atoms and molecules (mainly, those of $H_2O$, $O_2$, $N_2$ and $CO_2$) which are adsorbed to the inner wall of the reaction chamber 3 or which react with the material of the inner wall of the reaction chamber 3 to release a portion of the wall material into the vapor phase, and such released atoms and molecules or such a released wall material become mixed with the deposited film to obstruct formation or deposition of a film of high purity. For example, when a gas mixture of ($SiH_4 + N_2$) introduced into the gas decomposing chamber 1 by the gas introducing means 2 is decomposed to deposit a film of $Si_3N_4$ on the surface of the workpiece 4, atoms and molecules of $H_2O$, $O_2$ and $CO_2$ adsorbed to the inner wall of the reaction chamber 3 are released to mix in the vapor phase, with the result that a mixed film of $Si_3N_4$ and $SiO_2$ will be deposited on the surface of the workpiece 4. Therefore, a deposition apparatus is desired in which such atoms and molecules adsorbed to the inner wall of the reaction chamber 3 or the material of the inner wall of the reaction chamber 3 would not mix into the vapor phase.

SUMMARY OF THE INVENTION

It is a primary object of the present invention to provide a dry-processing apparatus in which both of the reflection of the active particles from the inner wall of the apparatus and the degassing from the inner wall of the apparatus are prevented so as to attain the desired vertical etching or impurity-free deposition.

In accordance with one aspect of the present invention which attains the above object, there is provided a dry-processing apparatus comprising an evacuatable chamber including a gas decomposing chamber and a reaction chamber, means for introducing gas into the gas decomposing chamber, means for decomposing the gas to produce active particles, a workpiece support disposed in the evacuatable chamber for supporting a workpiece which is to be subjected to surface processing by the flow of said active particles incident thereupon and an evacuation system for maintaining vacuum in the evacuatable chamber, the apparatus comprising a member providing substantially at least a portion of the inner wall of the evacuatable chamber to form a cold trap in that portion.

That is, the present invention attains the above object by lowering the surface temperature of the inner wall of the evacuatable chamber or by covering the inner wall of the evacuatable chamber with a cooled member. In other words, the present invention is based on the finding that the probability of reflection of particles from the surface of a substance placed in an evacuatable chamber and, also, the probability of desorption of atoms and molecules adsorbed to the surface of the substance can be reduced by lowering the surface temperature of the substance.

The present invention having such a feature has made it possible to provide a dry-processing apparatus in which the number of active particles reflected after impinging against the inner wall of the evacuatable chamber (mainly, the reaction chamber) can be minimized to permit the desired vertical etching. The present invention has also made possible to provide a dry-processing apparatus in which the probability of desorption of impurities adsorbed to the inner wall of the evacuatable chamber can be minimized to permit deposition of a film of good quality.

BRIEF DESCRIPTION OF THE DRAWINGS

FIG. 1 is a diagrammatic view showing the fundamental construction of a prior art dry-processing apparatus.

FIGS. 2A and 2B show schematically two sectional shapes of a workpiece subjected to vapor phase etching by an apparatus as shown in FIG. 1.

FIG. 3 is a diagrammatic view showing the fundamental construction of an embodiment of the dry-processing apparatus according to the present invention.

DESCRIPTION OF THE PREFERRED EMBODIMENTS

Figure 4:
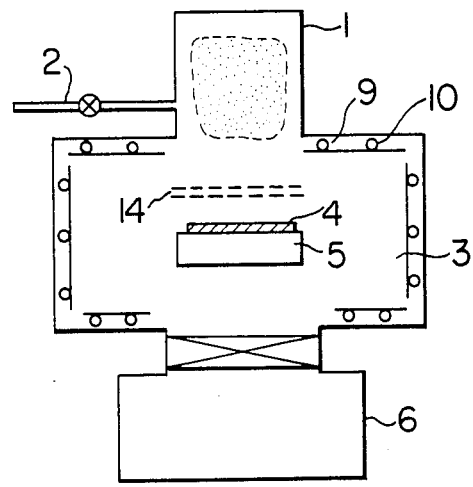
FIG. 4 is a diagrammatic view showing the construction of another embodiment of the present invention.

Preferred embodiments of the present invention will now be described in detail with reference to the drawings.

FIG. 3 shows diagrammatically the fundamental construction of a preferred embodiment of the dry-processing apparatus according to the present invention. In FIG. 3, the same reference numerals are used to designate the same or equivalent parts appearing in FIG. 1. The apparatus shown in FIG. 3 is greatly different from the prior art apparatus shown in FIG. 1 in that the inner wall of the reaction chamber 3 constituting an evacuatable chamber together with the gas decomposing chamber 1 is provided with cooling means for cooling with a coolant such as liquid nitrogen. This coolant is contained in a coolant tank 7 covering the inner wall of the reaction chamber 3. Further, in order to enhance the effect of thermal insulation, the outer wall of the coolant tank 7 is covered with an auxiliary vacuum tank 8 evacuated by an auxiliary evacuating system 6' including means such as a diffusion pump. The main evacuation system 6 may include a mechanical pump since its function is to regulate the pressure of etching gas or reaction gas.

The apparatus shown in FIG. 3 is preferably used for dry-etching of a semiconductor wafer 4 with $SF_6$ gas, since it can attain the desired vertical etching of the surface of the workpiece 4 with active particles only which are directly directed toward the surface of the workpiece 4 from the gas decomposing chamber 1, for the reason which will be described now. Among the active particles (ions and neutral radicals) produced in the gas decomposing chamber 1 by the function of the gas decomposing means, those incident upon the inner wall of the reaction chamber 3 are adsorbed to the inner wall of the reaction chamber 3 and would not be desorbed into the vapor phase again, because the temperature of the inner wall of the coolant tank 7 providing substantially the inner wall of the reaction chamber 3 is quite low. Therefore, the active particles directed directly from the gas decomposing chamber 1 toward the sample 4 are only those incident upon the surface of the workpiece 4. That is, the flow of the active particles from the gas decomposing chamber 1 toward the surface of the workpiece 4 is unidirectional. As a result, the desired vertical etching of the workpiece 4 can be effected by the unidirectional flow of the active particles.

Further, in order to ensure the vertical etching, means for parallelising the flow of the active particles emerging from the gas decomposing chamber 1 is preferably disposed between the gas decomposing chamber 1 and the workpiece support 5. Such means is provided in two forms. According to one of the two forms, the distance between the gas decomposing chamber 1 and the workpiece 4 is increased so that the solid angle between the gas decomposing chamber 1 and the subtending workpiece 4 can be made as small as possible. According to the other form, a pair of suitable mesh plates 14 are disposed between the gas decomposing chamber 1 and the workpiece 4. Apertures in the mesh plates 14 are registered to facilitate the down flow of the active particles. Further, in order to direct the neutral radicals only toward the workpiece 4, a suitable potential difference may be applied across the mesh plates 14 so that the mesh plates 14 act as electrodes which prevent passage of the ions therethrough. When the mesh plates 14 are interposed between the gas decomposing chamber 1 and the workpiece 4, the neutral radicals in the active particles can be selectively incident upon the surface of the workpiece 4 in a unidirectional flow which is, for example, vertical to the surface of the workpiece 4. Registration or alignment of the apertures in the mesh plates will further enhance the directivity of neutral radicals. Consequently, the desired vertical etching with the neutral radicals only can be applied to the workpiece 4 without any damage to the surface layer of the workpiece 4. It is also apparent that, when the apparatus of the present invention is used for film deposition on a semiconductor wafer while supplying a gas mixture of ($SiH_4+N_2$), the apparatus of the present invention can attain deposition of a film of high purity in view of the fact that the quantity of gas desorbed from the inner wall of the reaction chamber 3 is very small when this inner wall is cooled.

FIG. 4 shows another embodiment of the present invention. In FIG. 4, the same reference numerals are used to designate the same or equivalent parts appearing in FIG. 3. In the embodiment shown in FIG. 4, the inner wall of the reaction chamber 3 is covered with a cooling plate 9 which provides substantially the inner wall of the apparatus. The cooling plate 9 is cooled as it is in heat-exchange contact with a pipe 10 through which a coolant such as liquid nitrogen or a cooling fluid flows for the purpose of heat exchange. The effect of the embodiment shown in FIG. 4 is similar to that of the embodiment shown in FIG. 3. The embodiment shown in FIG. 4 is advantageous over that shown in FIG. 3 in that the former has a simpler construction.

In the embodiments described with reference to FIGS. 3 and 4, it is necessary to raise the internal pressure of the reaction chamber 3 up to the atmospheric pressure so that the workpiece 4 having been subjected to the surface processing can be exchanged for a new one. When this exchange is done in the state in which the inner wall of the reaction chamber 3 and the surface of the cooling plate 9 are still in a cold condition, water vapor in the atmosphere as well as atoms and molecules of $O_2$, $CO_2$, $N_2$, etc. will be adsorbed to these surfaces, and later evacuation of the reaction chamber 3 will become difficult or impossible. That is, the following steps are required for the workpiece exchange:

(1) The temperature of the inner wall of the reaction chamber or of the surface of the cooling plate is raised up to a level close to the room temperature.

(2) The internal pressure of the reaction chamber is raised up to a level close to the atmospheric pressure.

(3) The processed workpiece is exchanged for a new one.

(4) The reaction chamber is evacuated.

(5) The inner wall of the reaction chamber or the surface of the cooling plate is cooled.

A length of time of more than 1 hour is generally required for completion of the steps (1) to (5) described above, resulting in such a problem that the processing ability of the apparatus is extremely degraded.

Figure 5:
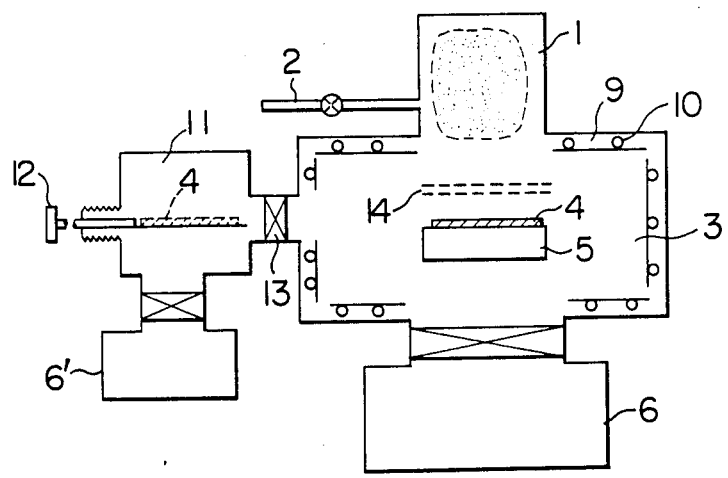
FIG. 5 is a diagrammatic view showing the construction of still another embodiment of the present invention.

Still another embodiment shown in FIG. 5 is constructed to deal with such a problem. In the embodiment shown in FIG. 5, a pre-evacuated chamber 11 evacuated by a pre-evacuating system 6", a workpiece exchange mechanism 12 and a gate valve 13 are additionally provided so that the processed workpiece 4 can be exchanged without raising the internal pressure of the reaction chamber 3 up to the atmospheric pressure level. Therefore, the steps (1), (2), (4) and (5) among the steps (1) to (5) are unnecessary, thereby improving the processing ability of the apparatus.

In the embodiments shown in FIGS. 3, 4 and 5, the inner wall of the reaction chamber only is cooled or it is covered with the cooling plate. However, when a discharge tube is used as the gas decomposing means in the gas decomposing chamber, it is desirable that this discharge tube is also cooled together with the reaction chamber.

According to the present invention described in detail hereinbefore, a member providing substantially the inner wall of the reaction chamber is cooled by a coolant so that active particles among those emerging from the gas decomposing chamber and reflected from the inner wall of the reaction chamber may not be incident upon a workpiece, and, also, impurities adsorbed to the inner wall of the reaction chamber may not be desorbed therefrom. Therefore, the apparatus of the present invention can achieve the desired vertical etching very satisfactorily and can effect deposition of a film of high-quality.

We claim:

1. A dry-processing apparatus comprising an evacuatable chamber including a gas decomposing chamber and a reaction chamber, said gas decomposing chamber and said reaction chamber being distinct from and connected to one another, means for introducing gas into said gas decomposing chamber, means for decomposing the gas to produce active particles in said decomposing chamber, a workpiece support disposed in said reaction chamber for supporting a workpiece, electrode means disposed between the gas decomposing chamber and the workpiece support and adapted to be applied with predetermined electric potential for allowing only neutral particles to flow therethrough from said decomposing chamber to said workpiece support, whereby the workpiece is to be subjected to surface processing by the flow of said neutral particles allowed to flow through said electrode means and being incident thereupon, an evacuation system for maintaining vacuum in said evacuatable chamber, and a cold trap provided along at least a portion of the inner wall of only said reaction chamber.

2. A dry-processing apparatus as claimed in claim 1, wherein said cold trap includes a coolant tank provided to cover the inner wall of said reaction chamber and containing a liquid nitrogen therein.

3. A dry-processing apparatus as claimed in claim 2, wherein an auxiliary vacuum tank is provided to cover the outer wall of said coolant tank.

4. A dry-processing apparatus as claimed in claim 1, wherein said cold trap includes a cooling plate provided to cover the inner wall of said reaction chamber and a pipe combined integrally with said cooling plate to flow a liquid nitrogen therethrough.

5. A dry-processing apparatus as claimed in claim 1, wherein said electrode means disposed between said gas decomposing chamber and said workpiece support also parallelizes the flow of said neutral particles emerging from said gas decomposing chamber to be incident upon said workpiece.

6. A dry-processing apparatus as claimed in claim 5, wherein said electrode means includes a pair of mesh plates; said predetermined electric potential being applied across said mesh plates to prevent the passage of ions therethrough while allowing neutral particles to flow therethrough.

7. A dry-processing apparatus for dry-processing a workpiece directionally, comprising:
 a gas decomposing chamber;
 a gas inlet for introducing a work gas into the gas decomposing chamber;
 a reaction chamber being distinct from and connected to said gas decomposition chamber, the substantial part of the inner wall of said reaction chamber being provided with means for forming a cold trap;

a support disposed in the reaction chamber for supporting a workpiece to be distanced from and facing toward the gas decomposing chamber; and apertured electrodes disposed between said gas decomposing chamber and said support and adapted to be applied with predetermined electric potentials for repelling charged particles away from said support and for allowing only neutral particles to pass therethrough and to impinge on the workpiece, whereby the workpiece is subjected to dry-processing by the neutral particles passing through the apertured electrodes and impinging on the workpiece.

8. A dry-processing apparatus according to claim 7, wherein said dry-processing is dry-etching.

9. A dry-processing apparatus according to claim 7, wherein said apertured electrodes include parallel plates with registered apertures.

* * * * *